United States Patent [19]

Usami

[11] Patent Number: 5,594,368

[45] Date of Patent: Jan. 14, 1997

[54] LOW POWER COMBINATIONAL LOGIC CIRCUIT

[75] Inventor: Kimiyoshi Usami, Kanagawa-ken, Japan

[73] Assignee: Kabushiki Kaisha Toshiba, Kawasaki, Japan

[21] Appl. No.: 423,943

[22] Filed: Apr. 19, 1995

[51] Int. Cl.⁶ .......................................... H03K 19/0175
[52] U.S. Cl. .................. 326/80; 326/81; 326/62; 326/63
[58] Field of Search ................... 326/80, 81, 63, 326/68

[56] References Cited

U.S. PATENT DOCUMENTS

| | | | |
|---|---|---|---|
| 4,977,339 | 12/1990 | Denda | 326/80 |
| 5,067,003 | 11/1991 | Okamura | 326/80 |
| 5,084,637 | 1/1992 | Gregor | 326/81 |
| 5,126,597 | 6/1992 | Usami | 326/80 |

*Primary Examiner*—Edward P. Westin
*Assistant Examiner*—Andrew Sanders
*Attorney, Agent, or Firm*—Foley & Lardner

[57] ABSTRACT

The power consumption by a combinational logic circuit having primary input and output terminals is reduced. The constituent gates of the combinational logic are clustered in terms of the operating voltage levels thereof. First, the gates driven with the highest operating voltage are clustered just adjacent to the primary input terminals. Next, the gates driven with the next higher voltage are clustered adjacent to the primary input terminals only through the gates driven with the highest voltage, followed by repetition of the same clustering procedure in the order of the operating voltage level. Finally, the gates driven with the lowest operating voltage are clustered just adjacent to the primary output terminals.

4 Claims, 3 Drawing Sheets

▨ GATE DRIVEN WITH V_DDL

☒ LEVEL CONVERTER

▨ GATE DRIVEN WITH V$_{DDL}$
⊠ LEVEL CONVERTER

LOW POWER COMBINATIONAL LOGIC CIRCUIT

BACKGROUND OF THE INVENTION

1. Field of the Invention

The present invention relates, in general, to a technique for reducing power consumption of very large scale integrated circuit (VLSI). More particularly, the present invention relates to low power combinational logic circuits utilized in very large scale semiconductor integrated circuits designed in order to effectively reduce power consumption thereof.

2. Description of the Prior Art

The energy necessary for driving CMOS logic circuits is consumed mainly as dynamic power for performing charging and discharging capacitances formed within the circuits. The dynamic power is proportional to the square of the operating voltage supplied to the CMOS logic circuits. The power consumption may be effectively decreased by lowering the operating voltage supplied to the CMOS logic circuits. However, when the operating voltage supplied to the CMOS logic circuits is lowered, the drain current of the transistors of the CMOS logic circuits is diminished and the delay of signal transmission through the CMOS logic circuits is increased, resulting in degradation of the characteristics of the CMOS logic circuits.

For example, if the operating voltage levels supplied to all the constituent gates of a CMOS combinational logic circuit as illustrated in FIG.1 are lowered in the same way for the purpose of saving power, the required timing specification is no longer satisfied with a timing critical path thereof.

On the other hand, usually not all the constituent gates of a CMOS logic circuit are forming timing critical paths. It seems therefore possible to lower only the operating voltage level supplied to the gates which are not forming critical paths and to supply the normal operating voltage level to the gates forming timing critical paths. However, in the case of CMOS logic circuits, level converter circuits must be interposed between each gate given the lowered operating voltage (VDDL) and the subsequent gates given the not lowered normal voltage, called hereinbelow the higher operating voltage (VDDH), for the purpose of preventing DC current from passing through the subsequent gates as described supra.

Next, description is directed to why such level converter circuits have to be provided between each gate given the lowered operating voltage VDDL and the subsequent gates given the higher operating voltage VDDH. Namely, when two different operating voltage levels are utilized to drive transistors designed in the form of CMOS logic circuits, static current may possibly flow through CMOS inverters given the higher operating voltage VDDH as illustrated in FIG. 2.

This is because the p-channel transistor MP1 of the CMOS inverters given the higher operating voltage VDDH can not completely be turned off, if the lowered operating voltage VDDL is lower than the higher operating voltage VDDH minus the threshold voltage Vthp of the p-channel transistor MP1, even when the preceding CMOS inverters given the lowered operating voltage VDDL output a logical high through an n-channel transistor MN1. The DC current passing through the CMOS inverters given the higher operating voltage VDDH is considerably large so that level converter circuits can not be dispensed with between each gate given the lowered operating voltage VDDL and the subsequent gates given the higher operating voltage VDDH.

An example of such a level converter circuit is illustrated in FIG. 3. The level converter circuit comprises a pair of the p-channel transistors MP2 and MP3 with the drain of each transistor connected to the gate of the other. The drain of the p-channel transistor MP2 is connected to ground through an n-channel transistor MN2 which is turned on and off in response to the signal IN from the gate driven with the lowered voltage VDDL. The drain of the other p-channel transistor MP3 is connected to ground through an n-channel transistor MN3 which is turned on and off in response to the signal IN from the gate driven with the lowered voltage VDDL. The n-channel transistors MN2 and MN3 are driven with the lowered voltage VDDL. Since the signal IN is given to the n-channel transistor MN3 through an inverter, one of the transistors MN2 and MN3 is turned on when the other is turned off.

Meanwhile, contrary to the above explained case, any gate given the higher operating voltage VDDH can be directly connected to the subsequent gates given the lowered operating voltage VDDL since no undesirable current passes through the subsequent gates given the lowered operating voltage VDDL whose input nodes receive the VDDH which is higher than the operating voltage of the transistor and therefore the p-channel transistor of the CMOS inverters given the lowered operating voltage VDDL can completely be turned off.

However, while level converter circuits prevent DC current from passing through the subsequent gates as described supra, there is consumed dynamic power during switching thereof when the number of level converter circuits increases. The power saving effect by lowering the operating voltage is therefore reduced by the provision of the level converter circuits.

For example, when some of the constituent gates of a CMOS logic circuit as illustrated in FIG. 1 are given the lowered operating voltage VDDL in accordance with the conventional technique, level converter circuits are interposed as illustrated in FIG. 4. In the figure, the gates given the lower voltage VDDL are distinctively shown by hatching and followed by level converters represented by symbols of checked squares. As seen from the figure, there are provided a number of level converter circuits between gates given the lower voltage VDDL and the gates given the higher operating voltage VDDH.

The provision of a number of level converter circuits substantially increases the total power consumption of the logic circuit and therefore is contradictory to the purpose of saving the operating power of the circuit by lowering the operating voltage supplied to the gates. Accordingly, it has not been tried heretofore to lower the operating voltage supplied to part of the constituent gates of a logic circuit.

SUMMARY OF THE INVENTION

The present invention has been made in order to solve the shortcomings as described above. It is an object of the present invention to reduce power consumption of very large scale integrated circuit.

It is another object of the present invention to provide low power combinational logic circuits utilized in very large scale semiconductor integrated circuits.

To achieve the foregoing and other object, and in accordance with the present invention, as embodied and broadly described herein, a combinational logic circuit has at least one primary input terminal and at least one primary output terminal and comprises a plurality of first gates each of which has input and output nodes and is driven with a first operating voltage and a plurality of second gates each of which has input and output nodes and is driven with a second operating voltage which is lower than the first power voltage. Any one of the output nodes of the second gates is connected only to either one of the input nodes of the second gates or one of the primary output terminals but not to any one of the input nodes of the first gates.

In a typical embodiment, the gates of a combinational logic circuit are clustered in terms of the operating voltage levels as follows. First, the gates driven with the highest operating voltage are clustered just adjacent to the primary input terminals. Next, the gates driven with the next higher voltage are clustered adjacent to the primary input terminals only through the gates driven with the highest voltage, followed by repetition of the same clustering procedure in the order of the operating voltage level. Finally, the gates driven with the lowest operating voltage are clustered just adjacent to the primary output terminals. Namely, in accordance with the present invention, the number of level converter circuits is no larger than the number of the primary output terminals so that the effect of power saving is significant.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION OF EMBODIMENTS

Figure 1:
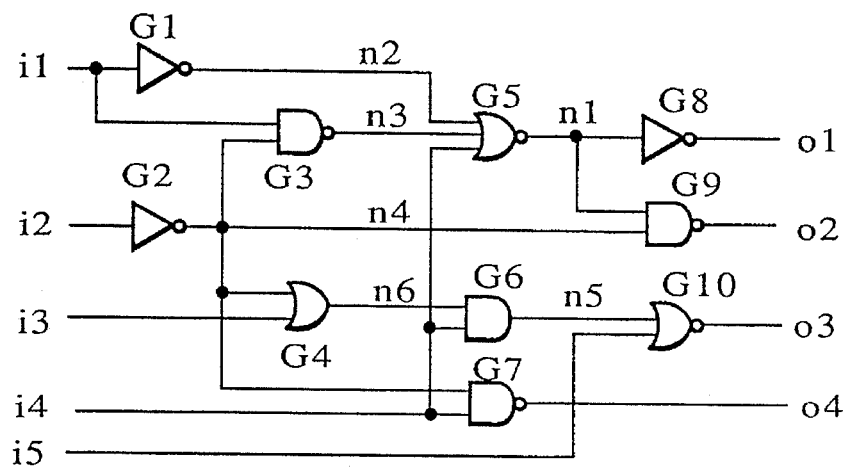
FIG. 1 is a block diagram showing a CMOS combinational logic circuit to which the present invention is applicable.

Referring now to the accompanying drawings, a semiconductor integrated circuit of the power saving design in accordance with an embodiment of the present invention will be described. In accordance with this embodiment, the power saving design is applied to the logic circuit as illustrated in FIG. 1. It is assumed that the signal at primary input terminals i1 to i5 and primary output terminals o1 to o5 becomes actually valid at an arrival times AT while the logic circuit is required to output signals through the primary output terminals o1 to o5 at required times (RT) in response to the signals input to the primary input terminals i1 to i5. In other words, the logic circuit is given a timing constraint corresponding to the differential time between AT at the primary input terminals and RT at the primary output terminals.

In order to reduce the power consumption of the logic circuit by lowering the operating voltage levels supplied to part of the respective constituent gates, the gates have to be picked out which can be driven by the lowered operating voltage VDDL without degrading the characteristics of the logic circuit as seen from the entire function of the logic circuit. It should be noted in this case to increase the number of gates driven by the lowered operating voltage VDDL with a smaller number of level converter circuits required in the logic circuit. For this purpose, the selection of the constituent gates to be driven with the lowered operating voltage VDDL is made under the constraint that any gate driven with the lowered operating voltage VDDL is not followed by a gate driven with the higher operating voltage VDDH.

First, it is assumed that all the logic gates of the logic circuit are given the higher operating voltage VDDH, for example, 5.0 V. The arrival time AT at each primary output terminal is then calculated by the known static path analysis, handling the entirety of the circuit. On the other hand, a required time is given to each primary output terminal as a timing constraint. The timing margin, i.e., a slack at each primary output terminal is therefore calculated as the difference between RT and AT.

If the timing margin is sufficient to be cut down (i.e., the slack is a plus value), the operating voltage supplied to some of the gates through which signals flow in the primary output terminal may possibly be lowered. Contrary to this, if the timing margin can no longer be cut down (i.e., the slack is zero or a minus value), the operating voltage supplied to the gates sequence flowing in the primary output terminal can not be lowered. With respect to the primary output terminals having sufficient timing margins, the following procedure is taken. All the primary output terminals o1, o2, o3 and o4 are assumed here to have sufficient margins for the purpose of explanation. The primary output terminals o1, o2, o3 and o4 are treated in turn. The order of selection of the primary output terminals is determined according to the heuristic method. For example, the primary output terminals are selected in sequence from that having a largest slack to that having a smallest slack in the order of the slack.

The primary output terminal o1 is assumed here to be first selected. The possibility of employment of the lowered operating voltage VDDL, for example, 3.3 V, is examined from the primary output terminal o1 toward the upstream thereof along the connection of gates. The examination is made in accordance with the so-called Depth-First-Search technique toward the depth of the circuit. The first gate to be examined is therefore the gate G8. The gate delay D8-VDDL is then calculated on the assumption that the operating voltage supplied to the gate G8 is lowered to the lowered operating voltage VDDH. The gate delay D8-VDDL is larger than the gate delay D8-VDDL which is calculated on the assumption that the operating voltage supplied to the gate G8 is the higher operating voltage VDDH. The arrival time AT at each primary output terminal is then calculated again by the known static path analysis, handling the entirety of the circuit, with the gate delay D8-VDDL. If all the slacks at the respective primary output terminals o1 to o4 are not negative, it is confirmed that the gate G8 can be driven with the lowered operating voltage VDDL. The possibility of employment of the lowered operating voltage VDDL is examined heretofore on the condition that the operating voltage supplied to the gate G8 is the lowered operating voltage VDDL.

The next gate to be examined is the gate G5. However, the output node of the gate G5 is connected not only to the gate G8 but also to the gate G9. In such a case, the possibility of employment of the lowered operating voltage VDDL is examined with respect the gate G9 in advance of examination of the gate G5. If it is confirmed by calculation of gate delay and the static path analysis that the gate G9 and the gate G5 can be driven with the lowered operating voltage VDDL, the similar examination is carried out with respect to the gate G1 and the gate G3. It is determined according to the heuristic method which the gate G1 or the gate G3 is examined first.

The examination of the possibility of employment of the lowered operating voltage VDDL is continued in this manner until the slack is calculated to be negative. If the slack is calculated to be negative or if the examination is continued to the primary input terminal, the examination is repeated from the next primary output terminal in the same manner. The possibility of employment of the lowered operating voltage VDDL for all the gates within the logic circuit can be examined by carried out the above procedure from all the primary output terminals.

As described above, if a gate under examination has its gate output line to which a plurality of gate inputs is connected (i.e., fan-out problem), it should be noted that in advance of examination of the subject gate the possibility of employment of the lowered operating voltage VDDL must be examined for all the gate in the downstream of the subject gate. For example, after confirmation of the possibility of driving the gate G8 with the lowered operating voltage VDDL, the gate G5 is in order of next examination. On the other hand, the selection of the constituent gates to be driven with the lowered operating voltage VDDL is made under the constraint that any gate driven with the lowered operating voltage VDDL is not followed by a gate driven with the higher operating voltage VDDH. Since the output node of the gate G5 is connected to the gate G8 and also to the gate G9 which has not be examined yet, it must be confirmed as a presupposition for examination of the gate G5 that the gate G9 can be driven also with the lowered operating voltage VDDL.

Figure 2:
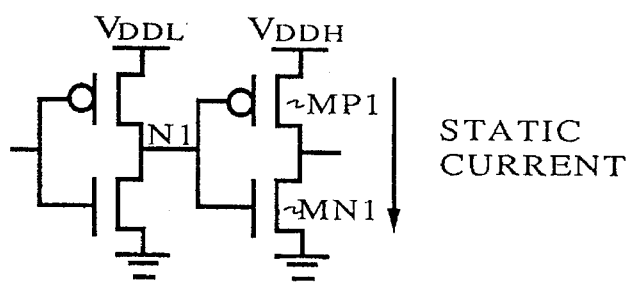
FIG. 2 is a circuit diagram showing a problem associated with direct connection between the gates driven with the higher operating voltage VDDH and the gates driven with the lowered operating voltage VDDL.
Figure 5:
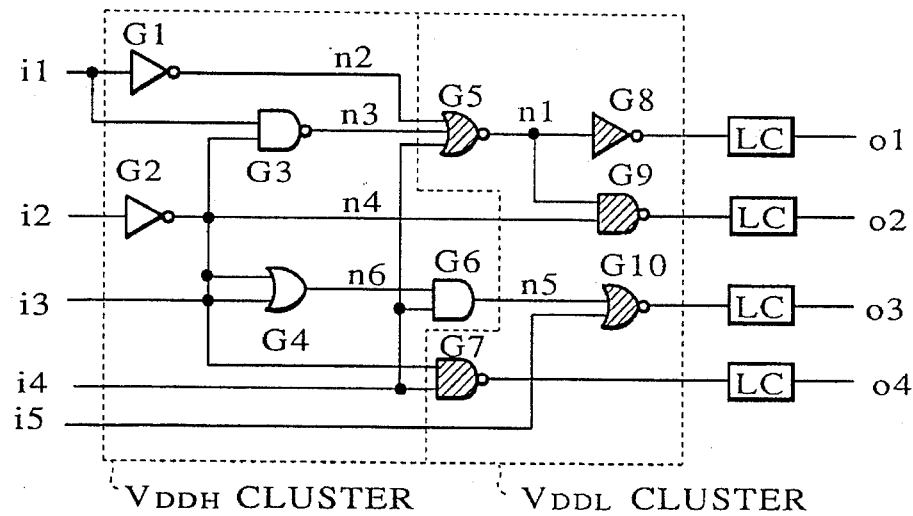
FIG. 5 is block diagram showing a CMOS combinational logic circuit in accordance with an embodiment of the present invention.

After completing examination of the possibility of employment of the lowered operating voltage VDDL with respect to all the constituent gates, the gates driven with the lowered operating voltage VDDL are clustered in the output side of the logic circuit while the gates driven with the higher operating voltage VDDH are clustered in the input side of the logic circuit as illustrated in FIG. 5 in which the gates given the lower voltage VDDL are distinctively shown by hatching. If the higher operating voltage VDDH is required to represent a high logic level at the primary output terminals, level converters LC as illustrated in FIG. 2 are provided between the clustered gates driven with the lowered operating voltage VDDL and the primary output terminals.

Within the logic circuit as designed above, input signals are transferred through paths consisting of the primary output terminals → the gates driven with the higher operating voltage VDDH → the gates driven with the lowered operating voltage VDDL → the level converters → the primary output terminals as illustrated in FIG. 5. As a result, any signal path is comprised of one of the following serial connections;

1) a primary input terminal → one of more gate driven with the higher operating voltage VDDH → one of more gate driven with the lowered operating voltage VDDL → a level converters → a primary output terminal;

2) a primary input terminal → one of more gate driven with the lowered operating voltage VDDL → a level converters → a primary output terminal; or 3) a primary input terminal → one of more gate driven with the higher operating voltage VDDH → a primary output terminal.

In the above case 3), since no gate driven with the lowered operating voltage VDDL is interposed in the path, the level converter can be dispensed with. In any case, since any gate driven with the lowered operating voltage VDDL is not followed by a gate driven with the higher operating voltage VDDH, the level converter need not be provided inside of the logic circuit.

Figure 3:
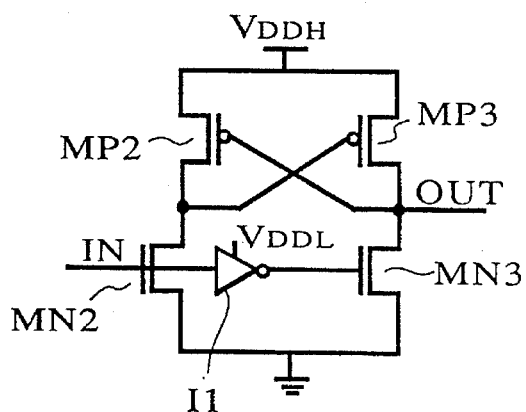
FIG. 3 is a circuit diagram showing a level converter circuit.
Figure 4:
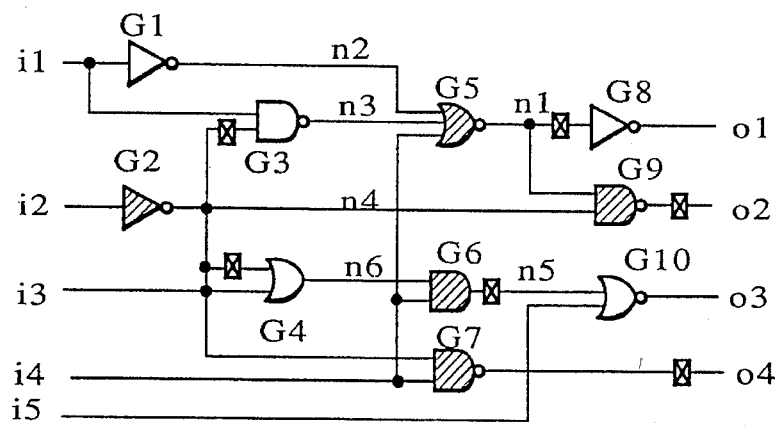
FIG. 4 is block diagram showing a problem associated with a CMOS combinational logic circuit whose operating voltage of some of the constituent gates is lowered to reduce power consumption.

When the present invention is applied to the constituent logic circuits of a processor, the advantage thereof can be enhanced by modifying the above described structure. Namely, in the case of the control logics of a processor, latch circuits are provided at many of the primary output terminals of a combinational logic circuit. In such a case, the level converter circuit as illustrated in FIG. 3 is replaced by a level convertible latch circuit as illustrated in FIG. 6 which can hold a signal level and convert the output voltage level from the lowered operating voltage VDDL to the higher operating voltage VDDH.

The level convertible latch circuit includes a latch circuit LH driven with the higher operating voltage VDDH. The latch circuit comprises a pair of inverters I2 and I3 coupled to each other with the input node of each inverter connected to the output node of the other. The output of the latch circuit LH is connected to the input node of an inverter I3 whose output functions as one of the primary output terminals.

The input node of the inverter I3 is connected to ground through an n-channel transistor MN4 which is turned on and off in response to the signal IN from a gate driven with the lowered voltage VDDL. The input node of the other inverter 2 is connected to ground through an n-channel transistor MN5 which is turned on and off in response to the signal IN from the gate driven with the lowered voltage VDDL. The n-channel transistors MN4 and MN5 are driven with the lowered voltage VDDL. Since the signal N is given to the n-channel transistor MN5 through an inverter, one of the transistors MN4 and MN5 is turned on when the other is turned off. The n-channel transistors MN6 and MN7 serve to make the latch circuit LH to latch a signal in synchronism with clock CLK. The circuit as illustrated in FIG. 6 can function as a latch circuit and also as a level converter circuit only with same power consumption as a usual latch circuit so that power saving effect is enhanced.

Figure 6:
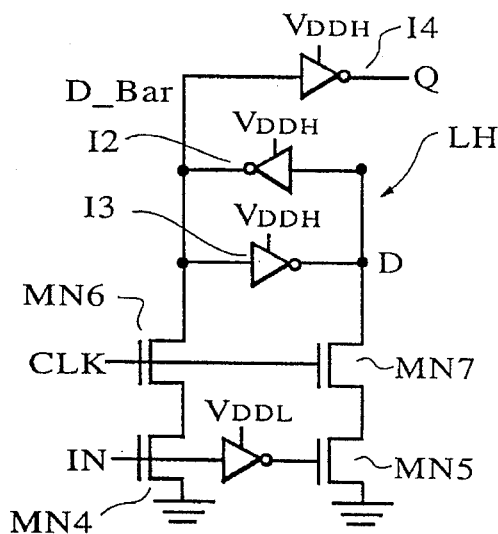
FIG. 6 is a circuit diagram showing a level convertible latch circuit which can hold a signal level and convert the output voltage level from the lowered operating voltage VDDL to the higher operating voltage VDDH.

Needless to say, the gates driven with the lowered operating voltage VDDL must be located just adjacent to the primary output terminals in order to make use of the level convertible latch circuit as illustrated in FIG. 6 for the gates driven with the lowered operating voltage VDDL. In other words, the level convertible latch circuit as illustrated in FIG. 6 can not be used for the purpose of a usual level converter circuit. The circuit design as proposed is therefore appropriate to make effective use of the advantageous level convertible latch circuit.

Furthermore, the circuit design as illustrated in FIG. 5 has many advantages in view of the pattern layout. This is because the gates driven with the higher operating voltage VDDH and the gates driven with the lowered operating voltage VDDL are separately clustered in a simple design.

Figure 7:
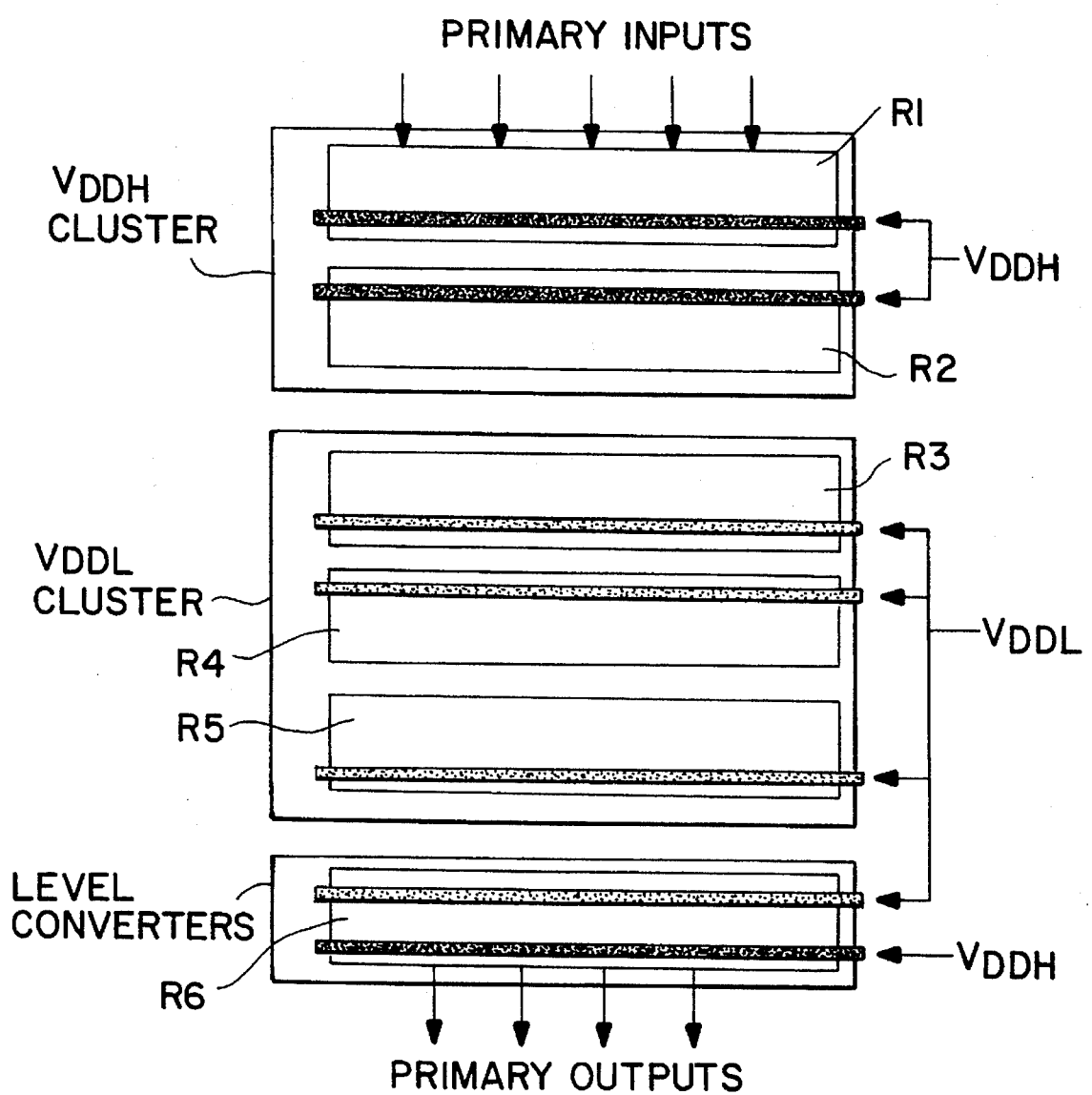
FIG. 7 is a schematic diagram showing a CMOS combinational logic circuit designed by the standard cell methodology in accordance with the present invention.

FIG. 7 is a schematic diagram showing an example of logic circuit designed in accordance with the present invention. The logic circuit is designed by the standard cell methodology. In the layout, standard cells including logic gates are arranged in a plurality of rows through which voltage source lines are passed in order to supply necessary electric power. Interconnection among these standard cells are made by means of wirings formed in spaces between adjacent rows, i.e. channel areas. In the figure, six rows are arranged to form the circuit design as illustrated in FIG. 5.

The gates driven with the higher operating voltage VDDH are arranged in the first and second rows R1 and R2. The gates driven with the lower voltage VDDL are arranged in the third and fifth rows R3 to R5. The lowest sixth row R6 is devoted to form the converter circuit as illustrated in FIG. 3 or the level convertible latch circuit as illustrated in FIG. 6. In this case, the primary input terminals are located in the upper side of the first row R1 while the primary output terminals are located in the lower side of the sixth row R6. The signal paths are therefore formed from the upper side to the lower side in a simple structure.

The pattern layout as illustrated in FIG. 7 has advantages from the view point of reducing the necessary area for the following two reasons. The first reason is that only one power line is necessary for one row except for the sixth row R6. Accordingly, the height of each row can be reduced by the dimension corresponding to one power line, as compared with the case that two power lines are formed through one row.

The other reason is related to separation of wells. If the gates driven with the higher operating voltage VDDH and the gates driven with the lowered operating voltage VDDL are located within a single row of standard cells forming CMOS logic circuits, constituent transistors are formed as follows. A p-channel transistor forming the gates driven with the higher operating voltage VDDH is usually formed within an n-well given the higher operating voltage VDDH. Also, a p-channel transistor forming the gates driven with the lowered operating voltage VDDL is usually formed within an n-well given the lowered operating voltage VDDL in the same manner. In the case that the p-channel transistor forming the gates driven with the lowered operating voltage VDDL is located adjacent to the p-channel transistor forming the gates driven with the higher operating voltage VDDH, the n-well given the higher operating voltage VDDH and the n-well given the lowered operating voltage VDDL can not be integrated but rather must be electrically separated from each other.

Contrary to this, since all the transistors formed within each row except for the sixth row R6 are driven with only one of the higher operating voltage VDDH and the lowered operating voltage VDDL in the pattern layout as illustrated in FIG. 7. The separation of wells are therefore not necessary in this case. Accordingly, the area occupied by the logic circuit can be reduced by the area which would otherwise be necessary for separation of wells.

In the above description, the embodiment is explained for the logic circuit driven with two different operating voltages (and ground (0 V)). However, the technical concept of the present invention can be easily applied for logic circuits utilizing three or more operating voltages, for example, 2.5 V, 3.3 V and 5 V. Namely, the gates of such a logic circuit are clustered in terms of the operating voltage levels as follows. First, the gates driven with the highest operating voltage are clustered just adjacent to the primary input terminals. Next, the gates driven with the next higher voltage are clustered adjacent to the primary input terminals only through the gates driven with the highest voltage, followed by repetition of the same clustering procedure toward the primary output terminals in the order of the operating voltage level. Finally, the gates driven with the lowest operating voltage are clustered just adjacent to the primary output terminals.

Also, in the above description, the embodiment is explained for the logic circuit is composed of the gates driven with the higher operating voltage VDDH and the gates driven with the lowered operating voltage VDDL and capable of outputting signals at the higher operating voltage VDDH or ground (0 V) through the level converter circuits. However, when some of the primary output terminals are connected only to logic circuits capable of operating with input signals of the lowered operating voltage VDDL, the level converter circuits can be dispensed with at such primary output terminals. In this case, the output signals of the gates driven with the lowered operating voltage VDDL are directly transferred to other logic circuits connected thereto without the level converter circuits.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A combinational logic circuit having at least one primary input terminal and at least one primary output terminal, comprising:

a plurality of first gates each of which has input and output nodes and is driven with a first operating voltage; and a plurality of second gates each of which has input an output nodes and is driven with a second operating voltage which is lower than said first operating voltage, wherein any one of the output nodes of said second gates is connected only to either one of the input nodes of said second gates or one of said primary output terminals but not to any one of the input nodes of said first gates, and wherein a level converter circuit is provided between at least one of said primary output terminals and at least one of said second gates.

2. The combinational logic circuit as claimed in claim 1 wherein said level converter circuit is a level convertible latch circuit which can hold a signal input thereto and convert a voltage level of the input signal from said second operating voltage to said first operating voltage.

3. The combinational logic circuit as claimed in claim 2 wherein said level convertible latch circuit is composed of a latch circuit comprising a pair of inverters driven with said first operating voltage and coupled to each other with the input node of each inverter connected to the output node of the other, the input node of one of said inverters being connected to ground through a first transistor which is turned on and off in response to the signal at said at least one of said second gates, the input node of the other of said inverters being connected to ground through a second transistor which is turned on and off in response to the signal at said at least one of said second gates in an opposite manner to operation of said first transistor.

4. A combinational logic circuit having at least one primary input terminal and at least one primary output terminal, comprising:

a plurality of first gates each of which has input and output nodes and is driven with a first operating voltage;

a plurality of second gates each of which has input and output nodes and is driven with a second operating voltage which is lower than said first operating voltage; and a plurality of third gates each of which has input and output nodes and is driven with a third operating voltage which is lower than said first operating voltage and higher than said second operating voltage, wherein any one of the output nodes of said second gates is connected only to either one of the input nodes of said second gates or one of said primary output terminals but not to any one of the input nodes of said first gates, and wherein the input node of any one of said third gates is connected only to either one of the output nodes of said first gates or one of said primary input terminals but not to any one of the input nodes of said first gates.

* * * * *